United States Patent
Gan et al.

(10) Patent No.: US 9,658,258 B2
(45) Date of Patent: May 23, 2017

(54) POWER CONVERSION SYSTEM AND VOLTAGE SAMPLING DEVICE THEREOF

(71) Applicant: Delta Electronics (Shanghai) Co., Ltd., Shanghai (CN)

(72) Inventors: Hong-Jian Gan, Shanghai (CN); Ming Wang, Shanghai (CN); Bo-Yu Pu, Shanghai (CN); Yi Zhang, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 22 days.

(21) Appl. No.: 14/732,781

(22) Filed: Jun. 8, 2015

(65) Prior Publication Data

US 2015/0362529 A1 Dec. 17, 2015

(30) Foreign Application Priority Data

Jun. 11, 2014 (CN) .......................... 2014 1 0258433

(51) Int. Cl.
*G01R 19/25* (2006.01)
*G01R 15/04* (2006.01)

(52) U.S. Cl.
CPC .......... *G01R 19/2509* (2013.01); *G01R 15/04* (2013.01)

(58) Field of Classification Search
CPC ........................ G01R 19/04; G01R 19/0084
See application file for complete search history.

(56) References Cited

U.S. PATENT DOCUMENTS

| | | | |
|---|---|---|---|
| 6,225,837 B1 | 5/2001 | Goumaz | |
| 7,924,062 B2 | 4/2011 | Chiu | |
| 2003/0222605 A1* | 12/2003 | Okamoto | ........... H05B 41/2928 315/308 |
| 2007/0194795 A1* | 8/2007 | Amanuma | ............. G01R 15/14 324/523 |

(Continued)

FOREIGN PATENT DOCUMENTS

| | | |
|---|---|---|
| CN | 2341310 Y | 9/1999 |
| CN | 2497481 Y | 6/2002 |
| CN | 2519284 Y | 10/2002 |

(Continued)

*Primary Examiner* — Clayton E Laballe
*Assistant Examiner* — Noam Reisner
(74) *Attorney, Agent, or Firm* — CKC & Partners Co., Ltd.

(57) ABSTRACT

A voltage sampling system is provided. The voltage sampling system includes a first and a second input paths and a signal-processing module. The first input path includes a first input voltage-dividing resistor unit, a second input voltage-dividing resistor unit and a first DC voltage-dividing resistor unit to generate a first input divided voltage and a first DC bias voltage to further generate a first sampled voltage signal according to a first input voltage and a DC voltage source. The second input path includes a third input voltage-dividing resistor unit, a fourth input voltage-dividing resistor unit and a second DC voltage-dividing resistor unit to generate a second input divided voltage and a second DC bias voltage to further generate a second sampled voltage signal according to a second input voltage and the DC voltage source. The signal-processing module receives the first and the second sampled voltage signals to perform signal processing.

22 Claims, 15 Drawing Sheets

(56) References Cited

U.S. PATENT DOCUMENTS

2013/0332099 A1  12/2013  Lai et al.
2015/0171772 A1*  6/2015  Tallam ................. G01R 31/343
                                                  363/41

FOREIGN PATENT DOCUMENTS

| CN | 1398038 A   | 2/2003  |
|----|-------------|---------|
| CN | 101718815 A | 6/2010  |
| CN | 102147427 A | 8/2011  |
| CN | 102291085 A | 12/2011 |
| CN | 102590599 A | 7/2012  |
| CN | 102638114 A | 8/2012  |
| CN | 103163359 A | 6/2013  |
| CN | 202978837 U | 6/2013  |
| CN | 203124942 U | 8/2013  |
| CN | 103698579 A | 4/2014  |
| TW | M363021 U1  | 8/2009  |

* cited by examiner

POWER CONVERSION SYSTEM AND VOLTAGE SAMPLING DEVICE THEREOF

RELATED APPLICATIONS

This application claims priority to Chinese Application Serial Number 201410258433.7, filed Jun. 11, 2014, which is herein incorporated by reference.

BACKGROUND

Field of Invention

The present invention relates to a voltage-sampling technology. More particularly, the present invention relates to a power conversion system and a voltage sampling device.

Description of Related Art

In a power system, a power conversion system has higher requirements of a current/voltage sensor as the grid voltage increases. Conventionally, an electromagnetic transformer is utilized to perform voltage sampling. However, the electromagnetic transformer has shortcomings such as possessing a complex insulation structure, being bulky and being expensive, etc. The electromagnetic transformer may also induce ferromagnetic resonance, which damages the equipments.

Developments of electronic transformers in recent years have improved a number of the shortcomings of an electromagnetic transformer, but certain theoretical and technical issues still remain in practical applications. It is very common for an electronic transformer to be interfered by common mode noise. When a sampled voltage possesses the common mode noise, an accuracy of the sampled voltage is dropped significantly. Consequently, a control circuit of the power conversion system cannot control an operation mode of the power conversion system accurately according to the sampled voltage, due to the interference caused by the common mode noise.

Therefore, an appropriate solution of a power conversion system and a voltage sampling device thereof has yet been developed, in order to address the above problems.

SUMMARY

The present disclosure provides a voltage sampling device. The voltage sampling device includes a first input path, a second input path and a signal processing module. The first input path includes a first input voltage-dividing resistor unit, a second input voltage-dividing resistor unit and a first DC (direct current) voltage-dividing resistor unit. The first input voltage-dividing resistor unit is electrically coupled between a first voltage input terminal and a first node. The first input voltage-dividing resistor unit receives a first input voltage from the first voltage input terminal. The second input voltage-dividing resistor unit is electrically coupled between the first node and a ground terminal, wherein the first input voltage-dividing resistor unit and the second input voltage-dividing resistor unit generate a first input divided voltage at the first node according to the first input voltage. The first DC voltage-dividing resistor unit is electrically coupled between the first node and a DC voltage source, wherein the DC voltage source generates a first DC bias voltage via the first DC voltage-dividing resistor unit at the first node, and the first DC bias voltage combines with the first input divided voltage to generate a first sampled voltage signal. The second input path includes a third input voltage-dividing resistor unit, a fourth input voltage-dividing resistor unit and a second DC voltage-dividing resistor unit. The third input voltage-dividing resistor unit is electrically coupled between a second voltage input terminal and a second node. The third input voltage-dividing resistor unit receives a second input voltage from the second voltage input terminal. The fourth input voltage-dividing resistor unit is electrically coupled between the second node and the ground terminal, wherein the third input voltage-dividing resistor unit and the fourth input voltage-dividing resistor unit generate a second input divided voltage at the second node according to the second input voltage. The second DC voltage-dividing resistor unit is electrically coupled between the second node and the DC voltage source, wherein the DC voltage source generates a second DC bias voltage via the second DC voltage-dividing resistor unit at the second node, and the second DC bias voltage combines with the second input divided voltage to generate a second sampled voltage signal. Resistances of the third input voltage-dividing resistor unit, the fourth input voltage-dividing resistor unit and the second DC voltage-dividing resistor unit are substantially the same as the first input voltage-dividing resistor unit, the second input voltage-dividing resistor unit and the first DC voltage-dividing resistor unit. The signal processing module receives the first sampled voltage signal and the second sampled voltage signal to perform signal processing.

An aspect of the present disclosure provides a power conversion system. The power conversion system includes a grid-side converter, a DC bus module, a motor-side converter and at least one voltage sampling device. The grid-side converter is electrically coupled to a power grid. The grid-side converter converts grid-side three-phase AC voltages to a plurality of DC bus voltages. The DC bus module includes a plurality of DC buses and at least one bus capacitor, wherein the bus capacitor is electrically coupled to two neighboring DC buses of the plurality of DC buses. The motor-side converter is electrically coupled to the grid-side converter via the DC bus module. The motor-side converter generates motor-side three-phase AC voltages according to the plurality of DC bus voltages transmitted by the DC bus module. The at least one voltage sampling device includes a first input path, a second input path and a signal processing module. The first input path includes a first input voltage-dividing resistor unit, a second input voltage-dividing resistor unit and a first DC voltage-dividing resistor unit. The first input voltage-dividing resistor unit is electrically coupled between a first voltage input terminal and a first node. The first input voltage-dividing resistor unit receives a first input voltage from the first voltage input terminal. The second input voltage-dividing resistor unit is electrically coupled between the first node and a ground terminal, wherein the first input voltage-dividing resistor unit and the second input voltage-dividing resistor unit generate a first input divided voltage at the first node according to the first input voltage. The first DC voltage-dividing resistor unit is electrically coupled between the first node and a DC voltage source, wherein the DC voltage source generates a first DC bias voltage via the first DC voltage-dividing resistor unit at the first node, and the first DC bias voltage combines with the first input divided voltage to generate a first sampled voltage signal. The second input path includes a third input voltage-dividing resistor unit, a fourth input voltage-dividing resistor unit and a second DC voltage-dividing resistor unit. The third input voltage-dividing resistor unit is electrically coupled between a second voltage input terminal and a second node. The third input voltage-dividing resistor unit receives a second input voltage from the second voltage input terminal. The fourth input voltage-dividing resistor unit is electrically coupled between the second node and the ground terminal, wherein the third input voltage-dividing resistor unit and the fourth input voltage-dividing resistor unit generate a second input divided voltage at the second node according to the second input voltage. The second DC voltage-dividing resistor unit is electrically coupled between the second node and the DC voltage source, wherein the DC voltage source generates a second DC bias voltage via the second DC voltage-dividing resistor unit at the second node, and the second DC bias voltage combines with the second input divided voltage to generate a second sampled voltage signal. Resistances of the third input voltage-dividing resistor unit, the fourth input voltage-dividing resistor unit and the second DC voltage-dividing resistor unit are substantially the same as the first input voltage-dividing resistor unit, the second input voltage-dividing resistor unit and the first DC voltage-dividing resistor unit. The signal processing module receives the first sampled voltage signal and the second sampled voltage signal to perform signal processing.

An advantage of the present disclosure is that by utilizing resistor units having a same structure in different input paths in the voltage sampling device, common mode noise can be effectively eliminated.

It is to be understood that both the foregoing general description and the following detailed description are by examples, and are intended to provide further explanation of the disclosure as claimed.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure. In the drawings.

DESCRIPTION OF THE EMBODIMENTS

Figure 1:
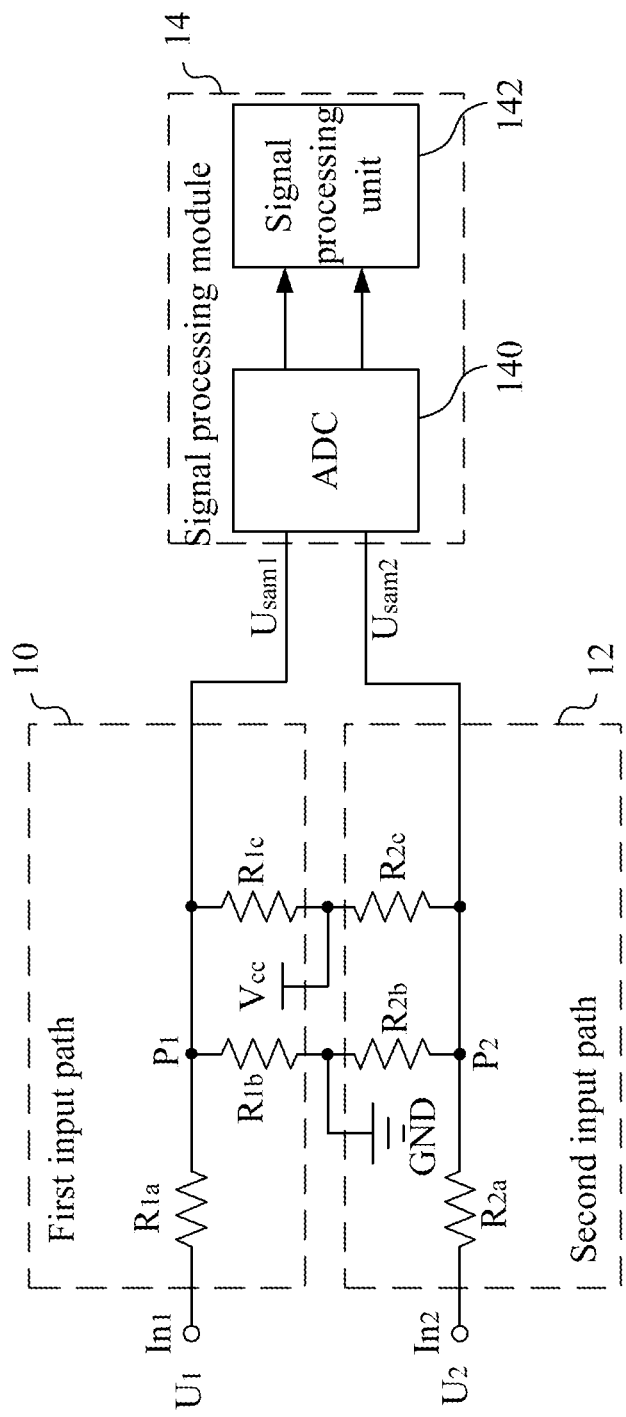
FIG. 1 is a schematic diagram illustrating a voltage sampling device according to an embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

Reference is now made to FIG. 1. FIG. 1 is a schematic diagram illustrating a voltage sampling device 1 according to an embodiment of the present disclosure. The voltage sampling device 1 includes a first input path 10, a second input path 12 and a signal processing module 14.

The first input path 10 includes a first input voltage-dividing resistor unit $R1_a$, a second input voltage-dividing resistor unit $R1_b$ and a first DC voltage-dividing resistor unit $R1_c$.

The first input voltage-dividing resistor unit $R1_a$ is electrically coupled between a first voltage input terminal $In_1$ and a first node $P_1$, so as to receive a first input voltage $U_1$ from the first voltage input terminal $In_1$. The first input voltage $U_1$ can be a DC (direct current) power source or an AC (alternating current) power source.

The second input voltage-dividing resistor unit $R1_b$ is electrically coupled between the first node $P_1$ and a ground terminal GND. The first input voltage-dividing resistor unit $R1_a$ and the second input voltage-dividing resistor unit $R1_b$ generate a first input divided voltage (not illustrated) at the first node $P_1$ according to the first input voltage $U_1$.

The first DC voltage-dividing resistor unit $R1_c$ is electrically coupled between the first node $P_1$ and a DC voltage source $V_{cc}$. The DC voltage source $V_{cc}$ generates a first DC bias voltage (not illustrated) at the first node $P_1$ via the first DC voltage-dividing resistor unit $R1_c$. The first DC bias voltage and the first input divided voltage are combined to generate a first sampled voltage signal $U_{sam1}$.

The second input path 12 includes a third input voltage-dividing resistor unit $R_{2a}$, a fourth input voltage-dividing resistor unit $R_{2b}$ and a second DC voltage-dividing resistor unit $R_{2c}$.

The third input voltage-dividing resistor unit $R_{2a}$ is electrically coupled between a second voltage input terminal $In_2$ and a second node $P_2$, so as to receive a second input voltage $U_2$ from the second voltage input terminal $In_2$. The second input voltage $U_2$ can be a DC (direct current) power source or an AC (alternating current) power source.

The fourth input voltage-dividing resistor unit $R_{2b}$ is electrically coupled between the second node $P_2$ and a ground terminal GND. The third input voltage-dividing resistor unit $R_{2a}$ and the fourth input voltage-dividing resistor unit $R_{2b}$ generate a second input divided voltage (not illustrated) at the second node $P_2$ according to the second input voltage $U_2$.

The second DC voltage-dividing resistor unit $R_{2c}$ is electrically coupled between the second node $P_2$ and the DC voltage source $V_{cc}$. The DC voltage source $V_{cc}$ generates a second DC bias voltage (not illustrated) at the second node $P_2$ via the second DC voltage-dividing resistor unit $R_{2c}$. The second DC bias voltage and the second input divided voltage are combined to generate a second sampled voltage signal $U_{sam2}$.

Resistances of the third input voltage-dividing resistor unit $R_{2a}$, the fourth input voltage-dividing resistor unit $R_{2b}$ and the second DC voltage-dividing resistor unit $R_{2c}$ are substantially the same as those of the first input voltage-dividing resistor unit $R1_a$, the second input voltage-dividing resistor unit $R1_b$ and the first DC voltage-dividing resistor unit $R1_c$ respectively. "Substantially the same" means that the resistances between the corresponding resistor units are not necessarily identical, but may be differed by a reasonable range, such as 5% and is not limited thereto.

The signal processing module 14 receives the first sampled voltage signal $U_{sam1}$ and the second sampled voltage signal $U_{sam2}$, so as to perform signal processing. In an embodiment, the signal processing module 14 includes an analog-to-digital converter (ADC) 140 and a signal processing unit 142. The ADC 140 firstly converts the first sampled voltage signal $U_{sam1}$ and the second sampled voltage signal $U_{sam2}$ from an analog format to a digital format, so that the signal processing unit 142 can perform subsequent signal processing. In an embodiment, the signal processing unit 142 can be implemented by, for instance, a CPLD (complex programmable logic device) or a FPGA (field programmable gate array), but is not limited thereto.

In an embodiment, the DC voltage source $V_{cc}$ mentioned above is a positive DC voltage source, and by utilizing the first DC bias voltage and the second DC bias voltage generated, the first input divided voltage and the second input divided voltage can be biased to a range acceptable by the signal processing module 14. For instance, when the signal processing module 14 can only process positive signals, and the first input divided voltage or the second input divided voltage is negative, the DC voltage source $V_{cc}$ can bias the negative divided voltage to a positive range, in order for the signal processing module 14 to process.

Therefore, the voltage sampling device 1 of the present embodiment can sample the first input voltage $U_1$ and the second input voltage $U_2$ via the voltage-dividing resistor units of the same resistance on the first input path 10 and the second input path 12, so as to suppress the common mode noise of the sampled voltage signal.

Figure 2:
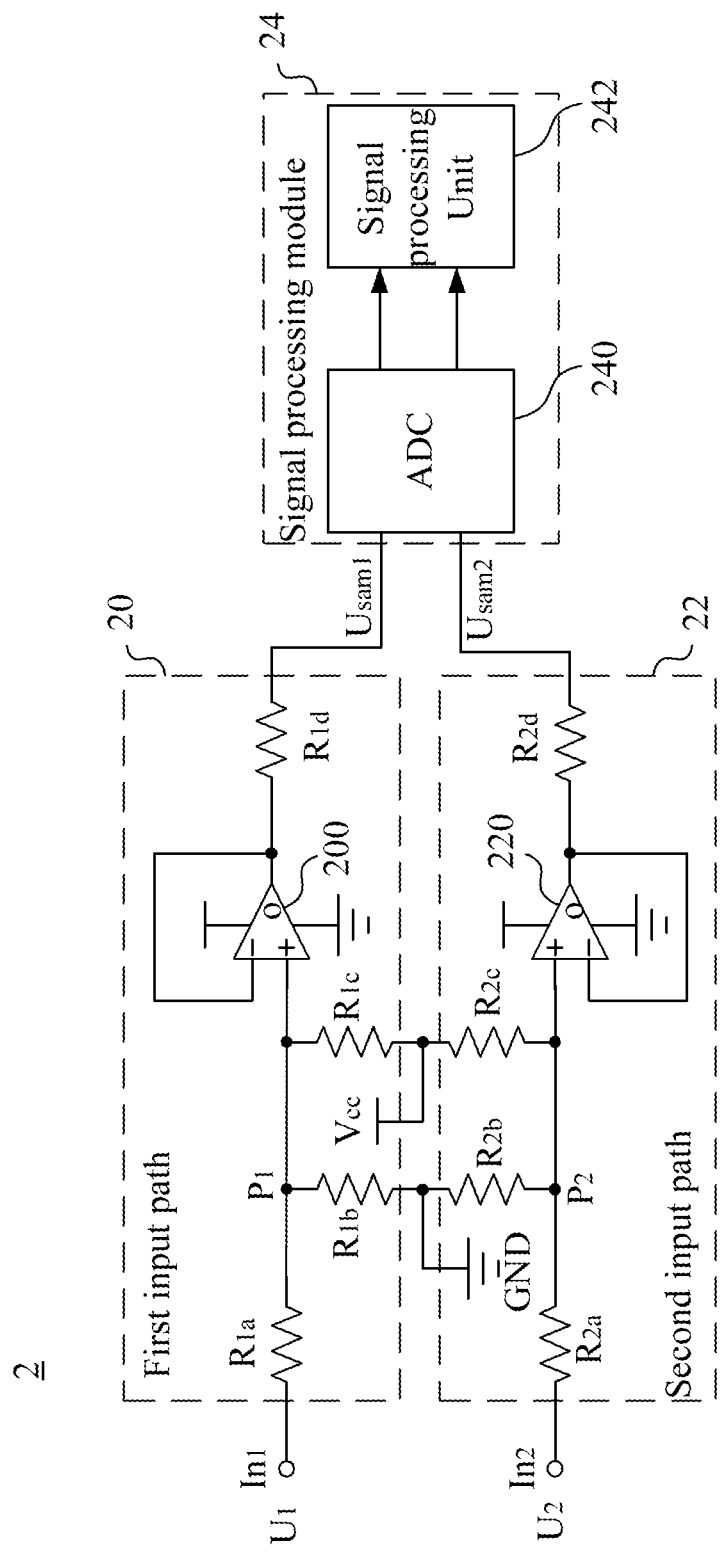
FIG. 2 is a schematic diagram illustrating a voltage sampling device according to another embodiment of the present disclosure.

Reference is now made to FIG. 2. FIG. 2 is a schematic diagram illustrating a voltage sampling device 2 according to another embodiment of the present disclosure. The voltage sampling device 2 includes a first input path 20, a second input path 22 and a signal processing module 24.

In the present embodiment, the first input path 20, which is similar to the first input path 10 shown in FIG. 1, includes a first input voltage-dividing resistor unit $R1_a$, a second input voltage-dividing resistor unit $R1_b$ and a first DC voltage-dividing resistor unit $R1_c$. The second input path 22, which is similar to the second input path 12 shown in FIG. 1, includes a third input voltage-dividing resistor unit $R_{2a}$, a fourth input voltage-dividing resistor unit $R_{2b}$ and a second DC voltage-dividing resistor unit $R_{2c}$. The signal processing module 24, which is similar to the signal processing module 14 shown in FIG. 1, includes an ADC (analog-to-digital converter) 240 and a signal processing unit 242. Operation mechanisms and connecting relations of the above components are similar to those shown in FIG. 1, so detailed descriptions are omitted hereinafter.

In the present embodiment however, the first input path 20 further includes a first voltage follower unit 200 and a first matching resistor unit $R_{1d}$.

The first voltage follower unit 200 is electrically coupled to the first node $P_1$, so as to transmit the first sampled voltage signal $U_{sam1}$ to the signal processing module 24 via the first voltage follower unit 200. The first matching resistor unit $R_{1d}$ is electrically coupled between the first voltage follower unit 200 and the signal processing module 24, so as to provide impedance matching.

In an embodiment, the first voltage follower unit 200 is implemented by an operational amplifier, where a non-inverting input terminal (shown as "+" in FIG. 2) is electrically coupled to the first node $P_1$ and an inverting input terminal (shown as "−" in FIG. 2) is electrically coupled to an output (shown as "o" in FIG. 2) of the voltage follower unit 200. The first voltage follower unit 200 is a circuit possessing a high input impedance and a low output impedance, so as to isolate the non-inverting input terminal and the output terminal. Therefore, a value of the first sampled voltage signal $U_{sam1}$ does not change with a magnitude of the first matching resistor unit $R_{1d}$. The first voltage follower unit 200 can therefore act like a buffer, for instance.

Similarly, the second input path 22 further includes a second voltage follower unit 220 and a second matching resistor unit $R_{2d}$. The second voltage follower unit 220 is electrically coupled to the second node $P_2$, so the second sampled voltage signal $U_{sam2}$ can be transmitted to the signal processing module 24 via the second voltage follower unit 220. The second matching resistor unit $R_{2d}$ is electrically coupled between the second voltage follower unit 220 and the signal processing module 24, so as to provide impedance matching. Structures and effects of the second voltage follower unit 220 are similar to those of the first voltage follower unit 200, so detailed descriptions are omitted hereinafter.

Therefore, in addition to sample the first input voltage $U_1$ and the second input voltage $U_2$ via the voltage-divided resistor units of the same resistance on the first input path 10 and the second input path 12, the voltage sampling device 1 of the present embodiment can further utilize implementations of the first voltage follower unit 200 and the second voltage follower unit 220 to suppress common mode noise and interference of the sampled voltage signals.

In FIG. 1 and FIG. 2, each resistor unit is represented by a single resistor. In different embodiments however, each resistor unit may include a plurality of resistors coupled in series and/or in parallel.

Figure 3:
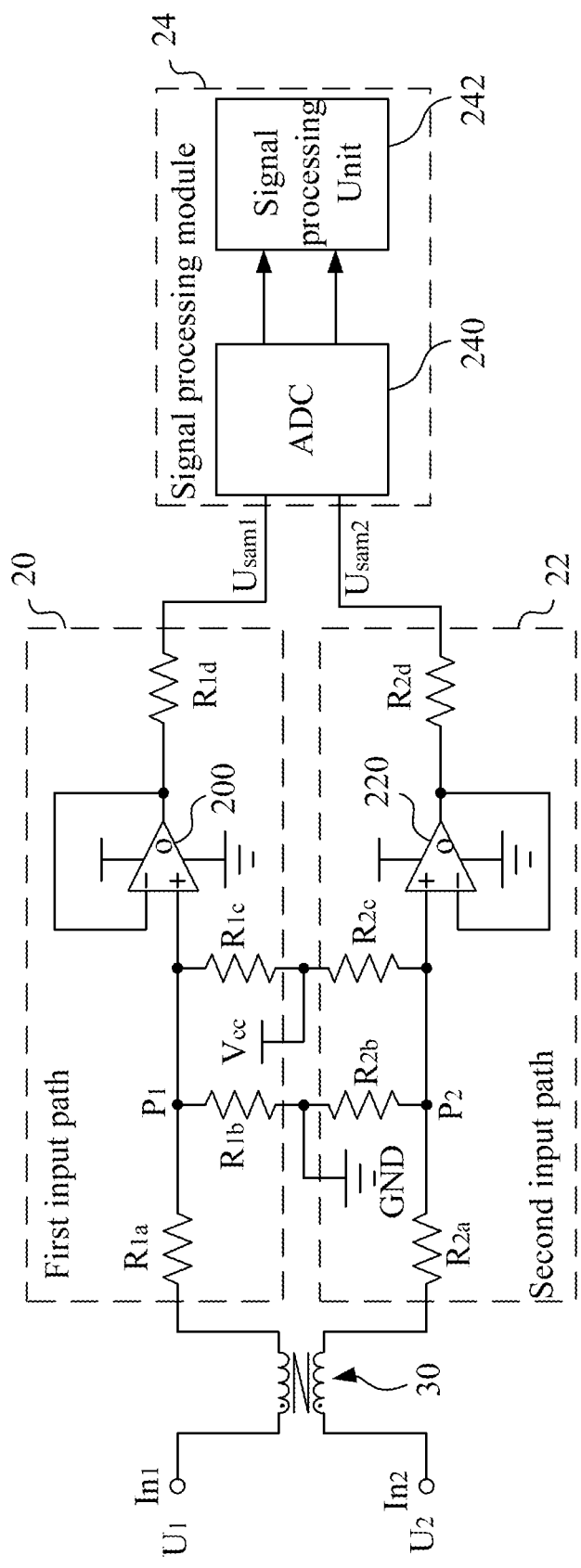
FIG. 3 is a schematic diagram illustrating a voltage sampling device according to another embodiment of the present disclosure.
Figure 4A:
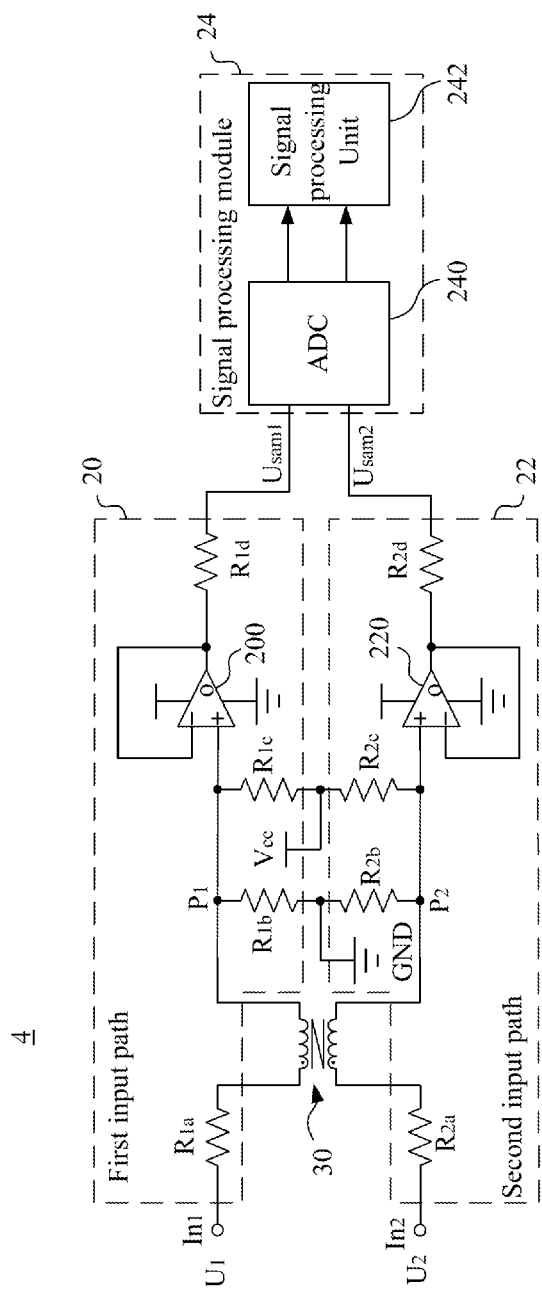
FIG. 4A is a schematic diagram illustrating a voltage sampling device according to another embodiment of the present disclosure.
Figure 4B:
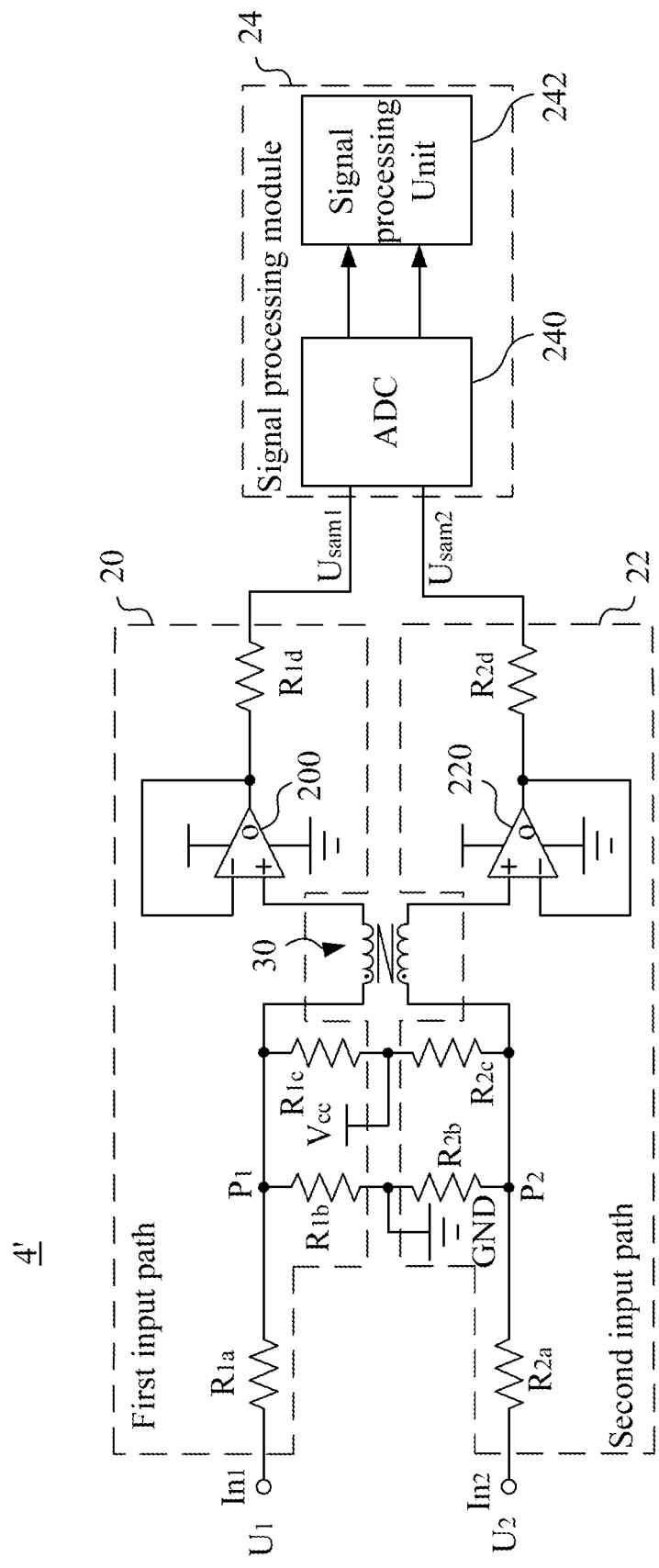
FIG. 4B is a schematic diagram illustrating a voltage sampling device according to another embodiment of the present disclosure.

Reference is now made to FIG. 3, FIG. 4A and FIG. 4B. FIG. 3 is a schematic diagram illustrating a voltage sampling device 3 according to another embodiment of the present disclosure. FIG. 4A is a schematic diagram illustrating a voltage sampling device 4 according to another embodiment of the present disclosure. FIG. 4B is a schematic diagram illustrating a voltage sampling device 4' according to another embodiment of the present disclosure. Each of the voltage sampling devices 3, 4 and 4' includes a first input path 20, a second input path 22, a signal processing module 24 and a common mode choke module 30.

In the embodiments shown in FIG. 3, FIG. 4A ad FIG. 4B, structures of the first input path 20, the second input path 22 and the signal processing module 24 are similar to those of FIG. 2, so detailed descriptions are omitted hereinafter.

In the present embodiment, the common mode choke module 30 can be implemented by a common mode choke. The common mode choke is a closed magnetic ring having wirings with a same number of turns, wound in symmetrically opposite directions. The common mode noise currents generated by the noise have a same direction when flowing pass the two windings, so the magnetic flux generated (i.e. the magnetic flux is of a same phase) is accumulated, and a high amount of impedance is produced at the choke coil, achieving common mode noise suppression. In an embodiment, the common mode choke module 30 is electrically coupled to the first input path 20 and the second input path 22, in order to eliminate the common mode noise of the voltage signals of these two input paths.

Taking FIG. 3 as an example. The common mode choke module 30 is electrically coupled between the first voltage input terminal $In_1$ and the first input voltage-dividing resistor unit $R1_a$ of the first input path 20, as well as between the second voltage input terminal $In_2$ and the second input voltage-dividing resistor unit $R_{2a}$ of the second input path 22.

Taking FIG. 4A as an example. The common mode choke module 30 is electrically coupled between the first input voltage-dividing resistor unit $R1_a$ and the first node $P_1$ of the first input path 20, as well as between the second input voltage-dividing resistor unit $R_{2a}$ and the second node $P_2$ of the second input path 22.

Taking FIG. 4B as an example. The common mode choke module 30 is electrically coupled between the first node $P_1$ of the first input path 20, the second node $P_2$ of the second input path 22 and the signal processing module 24. More specifically, the common mode choke module 30 is electrically coupled between the first node $P_1$ and the non-inverting input terminal of the first voltage follower unit 200 of the first input path 20, as well as between the second node $P_2$ and the non-inverting input terminal of the second voltage follower unit 220 of the second input path 22.

Figure 5:
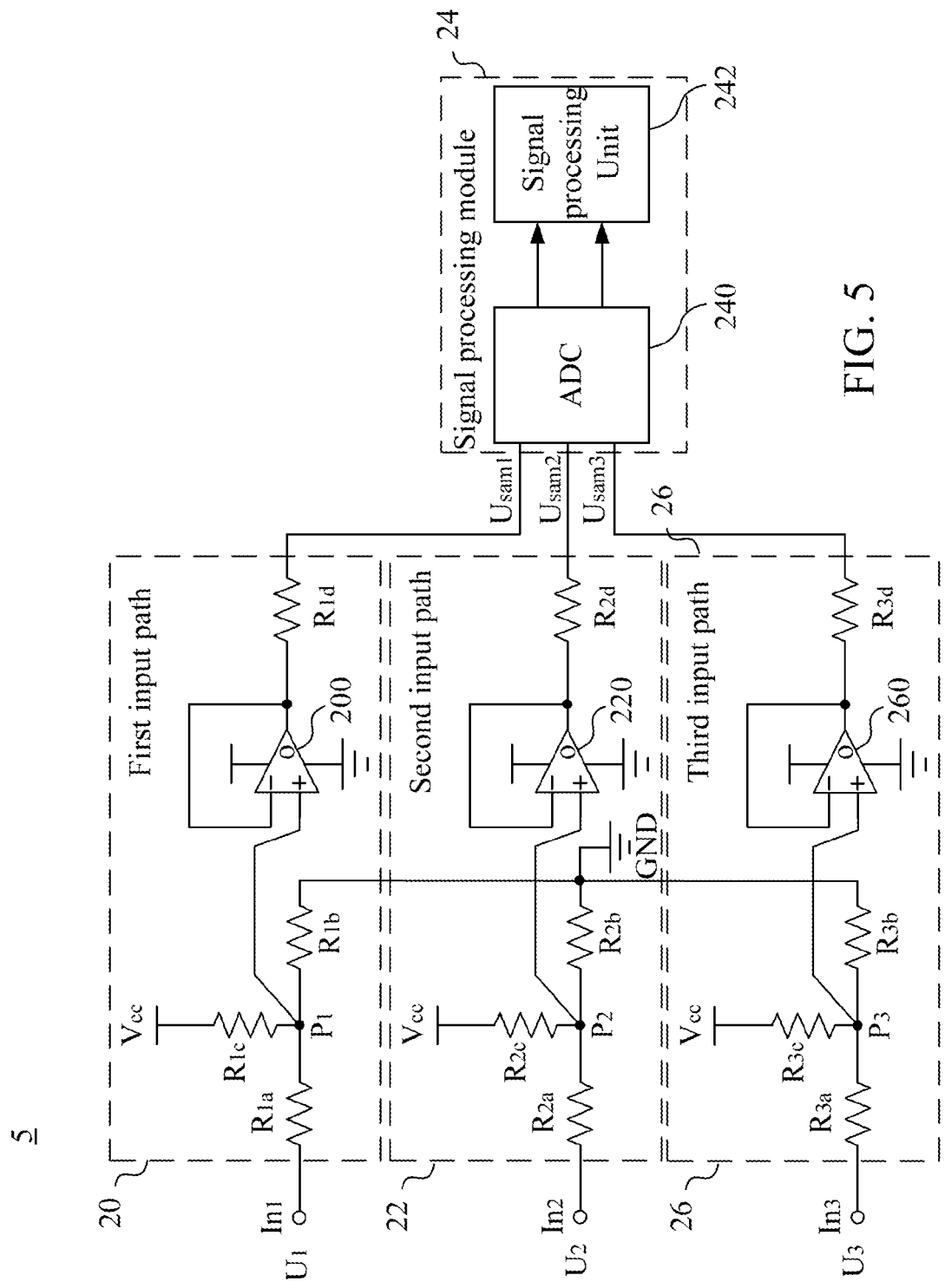
FIG. 5 is a schematic diagram illustrating a voltage sampling device according to another embodiment of the present disclosure.

Reference is now made to FIG. 5. FIG. 5 is a schematic diagram illustrating a voltage sampling device 5 according to another embodiment of the present disclosure. The voltage sampling device 5 includes a first input path 20, a second input path 22, a signal processing module 24 and a third input path 26.

In the present embodiment, structures of the first input path 20, the second input path 22, and the signal processing module 24 are similar to those shown in FIG. 2, and relative descriptions are omitted hereinafter.

The third input path 26 includes a fifth input voltage-dividing resistor unit $R_{3a}$, a sixth input voltage-dividing resistor unit $R_{3b}$, a third DC voltage-dividing resistor unit $R_{3c}$, a third voltage follower unit 260 and a third matching resistor unit $R_{3d}$.

The fifth input voltage-dividing resistor unit $R_{3a}$ is electrically coupled between the third voltage input terminal $In_3$ and the third node $P_3$, so as to receive a third input voltage $U_3$ from the third voltage input terminal $In_3$. The third input voltage $U_3$ can be a DC (direct current) power source or an AC (alternating current) power source.

The sixth input voltage-dividing resistor unit $R_{3b}$ is electrically coupled between the third node $P_3$ and a ground terminal GND. The fifth input voltage-dividing resistor unit $R_{3a}$ and the sixth input voltage-dividing resistor unit $R_{3b}$ generate a third input divided voltage (not illustrated) at the third node $P_3$ according to the third input voltage $U_3$.

The third DC voltage-dividing resistor unit $R_{3c}$ is electrically coupled between the third node $P_3$ and a DC voltage source $V_{cc}$. The DC voltage source $V_{cc}$ generates a third DC bias voltage (not illustrated) at the third node $P_3$ via the third DC voltage-dividing resistor unit $R_{3c}$. The third DC bias voltage and the third input divided voltage are combined to generate a third sampled voltage signal $U_{sam3}$.

Resistances of the fifth input voltage-dividing resistor unit $R_{3a}$, the sixth input voltage-dividing resistor unit $R_{3b}$ and the third DC voltage-dividing resistor unit $R_{3c}$ are substantially the same as those of the first input voltage-dividing resistor unit $R1_a$, the second input voltage-dividing resistor unit $R1_b$ and the first DC voltage-dividing resistor unit $R1_c$ respectively.

The third voltage follower unit 260 is electrically coupled to the third node $P_3$, so the third sampled voltage signal $U_{sam3}$ is transmitted to the signal processing module 24 via the third voltage follower unit 260. The third matching resistor unit $R_{3d}$ is electrically coupled between the third voltage follower unit 260 and the signal processing module 24, so as to provide impedance matching.

Therefore, the voltage sampling device 5 of the present embodiment can sample three voltage input terminals, and can perform sampling the first input voltage $U_1$, the second input voltage $U_2$ and the third input voltage $U_3$ via the voltage-divided resistor units of the same resistance on the first input path 20, the second input path 22 and the third input path 26 respectively.

Figure 6:
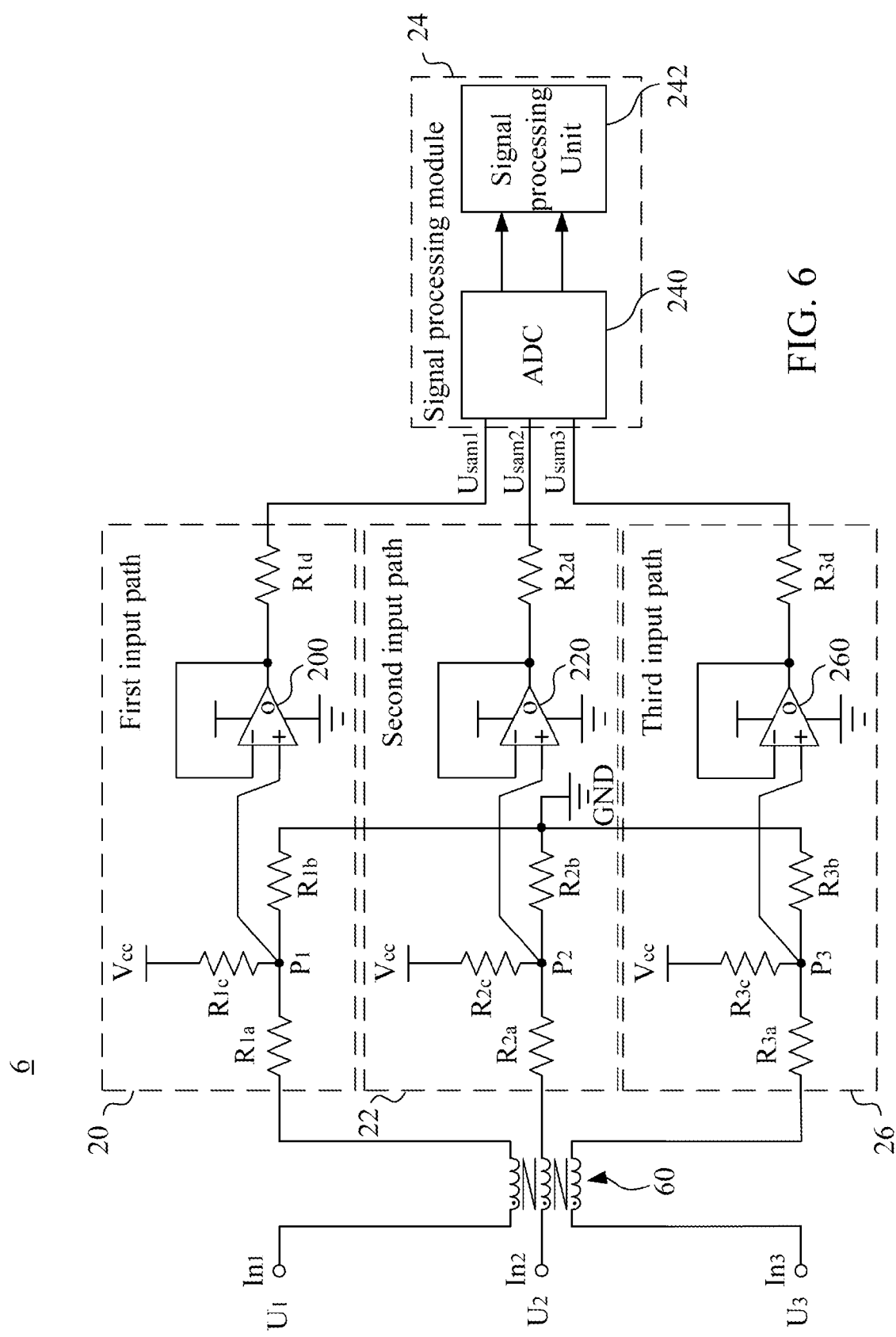
FIG. 6 is a schematic diagram illustrating a voltage sampling device according to an embodiment of the present disclosure.
Figure 7A:
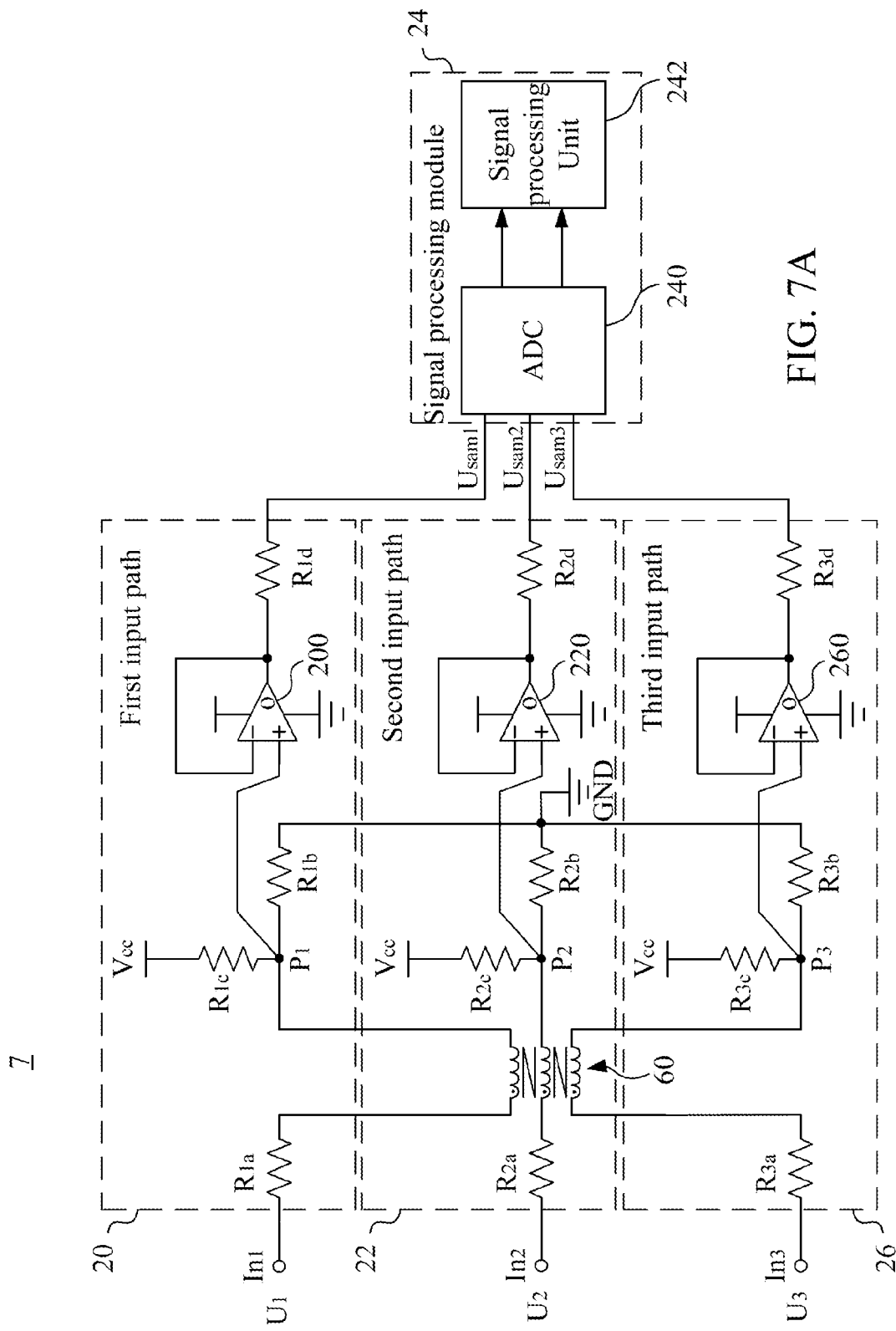
FIG. 7A is a schematic diagram illustrating a voltage sampling device according to another embodiment of the present disclosure.
Figure 7B:
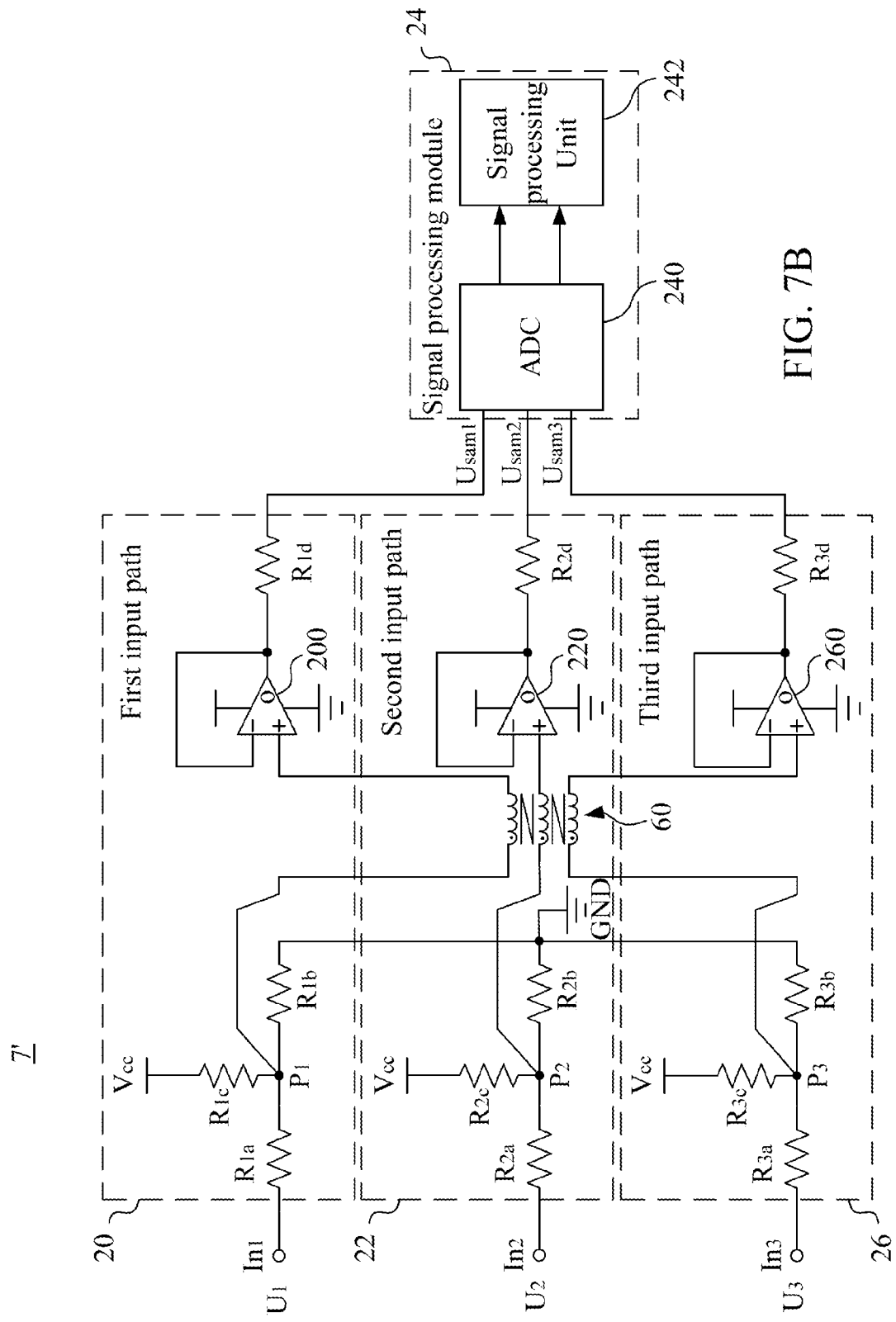
FIG. 7B is a schematic diagram illustrating a voltage sampling device according to another embodiment of the present disclosure.

Reference is now made to FIG. 6, FIG. 7A and FIG. 7B. FIG. 6 is a schematic diagram illustrating a voltage sampling device 6 according to an embodiment of the present disclosure. FIG. 7A is a schematic diagram illustrating a voltage sampling device 7 according to another embodiment of the present disclosure. FIG. 7B is a schematic diagram illustrating a voltage sampling device 7' according to another embodiment of the present disclosure. Each of the voltage sampling devices 6, 7 and 7' includes a first input path 20, a second input path 22, a signal processing module 24, a third input path 26 and a common mode choke module 60.

In the present embodiment, structures of the first input path 20, the second input path 22, the signal processing module 24 and the third input path 26 shown in FIG. 6, FIG. 7A and FIG. 7B are similar to those of FIG. 5, so relative descriptions are omitted hereinafter.

In an embodiment, the common mode choke module 60 can be implemented by two common mode chokes, whereas one is electrically coupled to the first input path 20 and the second input path 22, while the other is electrically coupled to the second input path 22 and the third input path 26, so as to eliminate the common mode noise of the voltage signals of these three input paths. The common mode choke module 60 can be electrically coupled between the voltage input terminals and the input voltage-dividing resistor units of each input path. For instance, as shown in FIG. 6, the common mode choke module 60 is electrically coupled between the first voltage input terminal $In_1$, the first input voltage-dividing resistor unit $R1_a$, the second voltage input terminal $In_2$, the third input voltage-dividing resistor unit $R_{2a}$, the third voltage input terminal $In_3$ and the fifth input voltage-dividing resistor unit $R_{3a}$.

In another embodiment, the common mode choke module 60 is electrically coupled to the first input voltage-dividing resistor unit $R1_a$, the first node $P_1$ the third input voltage-dividing resistor unit $R_{2a}$, the second node $P_2$, the fifth input voltage-dividing resistor unit $R_{3a}$ and the third node $P_3$, as shown in FIG. 7A.

In yet another embodiment, the common mode choke module 60, as shown in FIG. 7B, is electrically coupled to the first node $P_1$, the second node $P_2$, the third node $P_3$ and the signal processing module 24. More specifically, the common mode choke module 60 can be electrically coupled to the first node $P_1$, the non-inverting input terminal of the first voltage follower unit 200, the second node $P_2$, the non-inverting input terminal of the second voltage follower unit 220, the third node $P_3$ and the non-inverting input terminal of the third voltage follower unit 260.

Figure 8A:
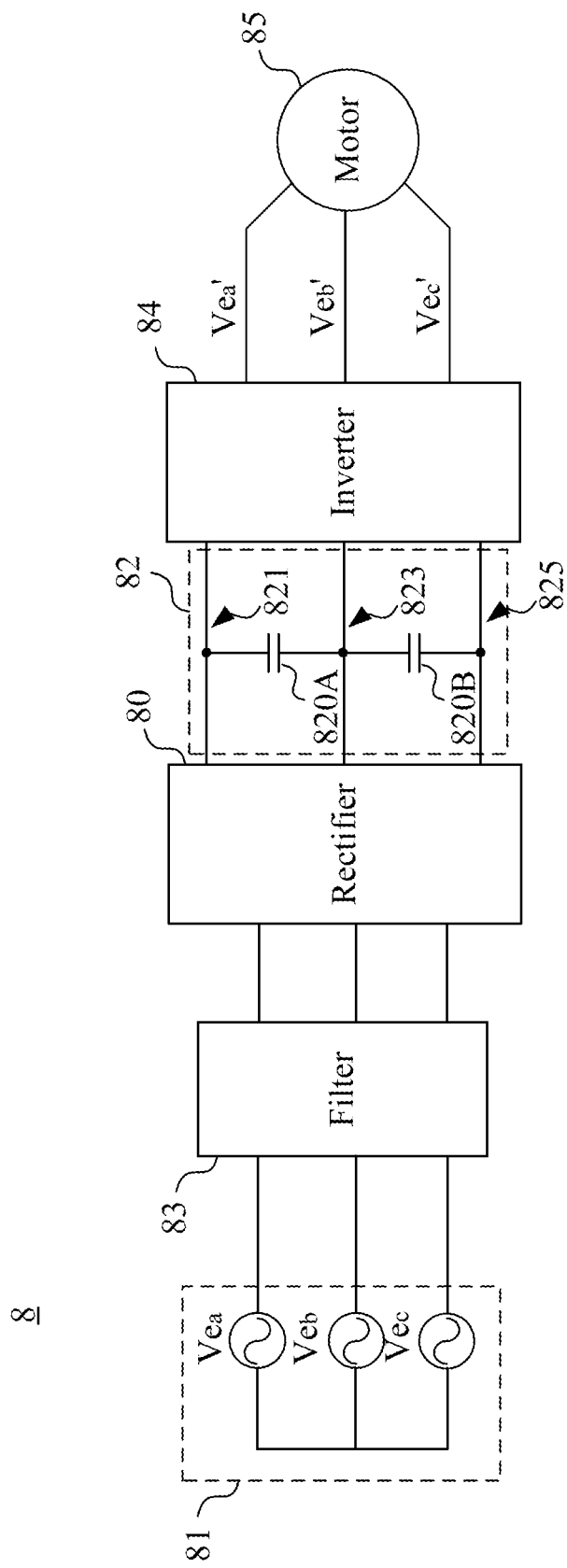
FIG. 8A is a block diagram illustrating a power conversion system according to an embodiment of the present disclosure.

Reference is now made to FIG. 8A. FIG. 8A is a block diagram illustrating a power conversion system 8 according to an embodiment of the present disclosure. The power conversion system 8 includes a rectifier 80, a DC bus module 82 and an inverter 84.

The rectifier 80 is electrically coupled to a power grid 81. In an embodiment, the rectifier 80 includes a plurality of switches (not illustrated), such as but not limited to, IGBTs (Insulated Gate Bipolar Transistor). By turning the switches on and off, the three-phase AC voltages $Ve_a$, $Ve_b$ and $Ve_c$ of the power grid 81 can be converted to DC bus voltages.

In an embodiment, the power conversion system 8 can further include a filter 83. The rectifier 80 can receive the three-phase AC voltages $Ve_a$, $Ve_b$ and $Ve_c$ via the filter 83. The filter 83 can restrain a harmonic current flowing into the power grid 81.

The DC bus module 82 can transmit DC voltages. In the present embodiment, the DC bus module 82 includes DC buses 821, 823 and 825, and bus capacitors 820A and 820B. The bus capacitor 820A or 820B can be a single capacitor, or a plurality of capacitors connected in series or a plurality of capacitors connected in parallel. The bus capacitor 820A is electrically coupled to the DC buses 821 and 823. The bus capacitor 820B is electrically coupled to the DC buses 823 and 825. The bus capacitors 820A and 820B act as supports and filters for voltages of the DC buses 821, 823 and 825. In another embodiment, the DC bus module can include two DC buses and a bus capacitor. The Bus capacitor is electrically coupled between the two DC buses and acts as the support and the filter for the two DC buses.

The invertor 84 is electrically coupled to the rectifier 80 via the DC bus module 82, so as to generate loading three-phase AC voltages $Ve_a'$, $Ve_b'$ and $Ve_c'$ according to a DC bus voltage transmitted by the DC bus module 82. In an embodiment, the inverter 84 can further be electrically connected to a motor 85, and the motor 85 can be driven by the loading three-phase AC voltages $Ve_a'$, $Ve_b'$ and $Ve_c'$.

Figure 8B:
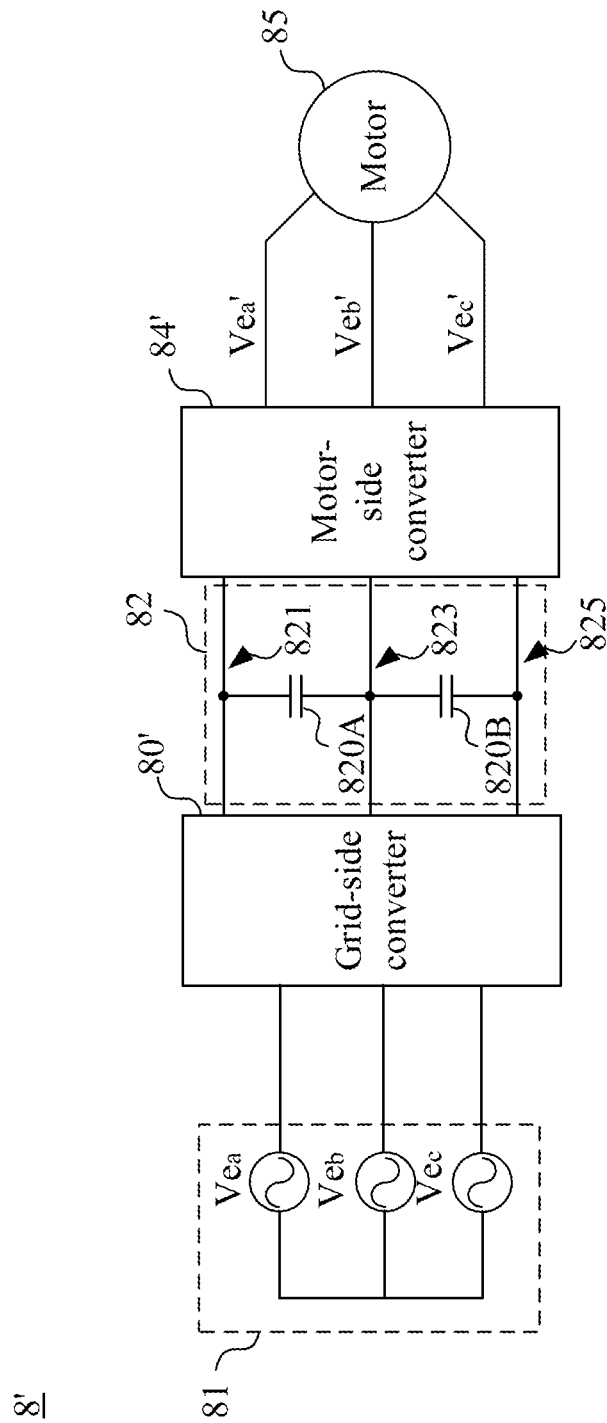
FIG. 8B is a block diagram illustrating a power conversion system according to an embodiment of the present disclosure.

Reference is now made to FIG. 8B. FIG. 8B is a block diagram illustrating a power conversion system 8' according to an embodiment of the present disclosure. The power conversion system 8' includes a grid-side converter 80', a DC bus module 82 and a motor-side converter 84'.

The grid-side converter 80' is electrically coupled to a power grid 81. In an embodiment, the grid-side converter 80' includes a plurality of switches (not illustrated), such as but not limited to, IGBTs (Insulated Gate Bipolar Transistor). Grid-side three-phase AC voltages $Ve_a$, $Ve_b$ and $Ve_c$ of the power grid 81 can be converted to DC bus voltages, according to on/off operations of the switches.

The DC bus module 82 can transmit DC bus voltages. In the present embodiment, the DC bus module 82 includes DC buses 821, 823 and 825, and bus capacitors 820A and 820B. The bus capacitor 820A is electrically coupled to the DC buses 821 and 823. The bus capacitor 820B is electrically coupled to the DC buses 823 and 825. The bus capacitors 820A and 820B act as supports and filters for the voltages of the DC buses 821, 823 and 825.

The motor-side converter 84' is electrically coupled to the grid-side converter 80' via the DC bus module 82, so as to generate the motor-side three-phase AC voltages $Ve_a'$, $Ve_b'$ and $Ve_c'$ according to the DC bus voltages transmitted by the DC bus module 82. In an embodiment, the motor-side converter 84' can further be electrically coupled to the motor 85, so as to drive the motor 85 according to the motor-side three-phase AC voltages $Ve_a'$, $Ve_b'$ and $Ve_c'$.

The voltage sampling device of the present disclosure, such as the voltage sampling devices 1-7' shown in FIG. 1 to FIG. 7B, can be disposed in the power conversion system 8 of FIG. 8A or the power conversion system 8' of FIG. 8B, in order to sample voltage signals of the power conversion system 8 or the power conversion system 8'.

Figure 9:
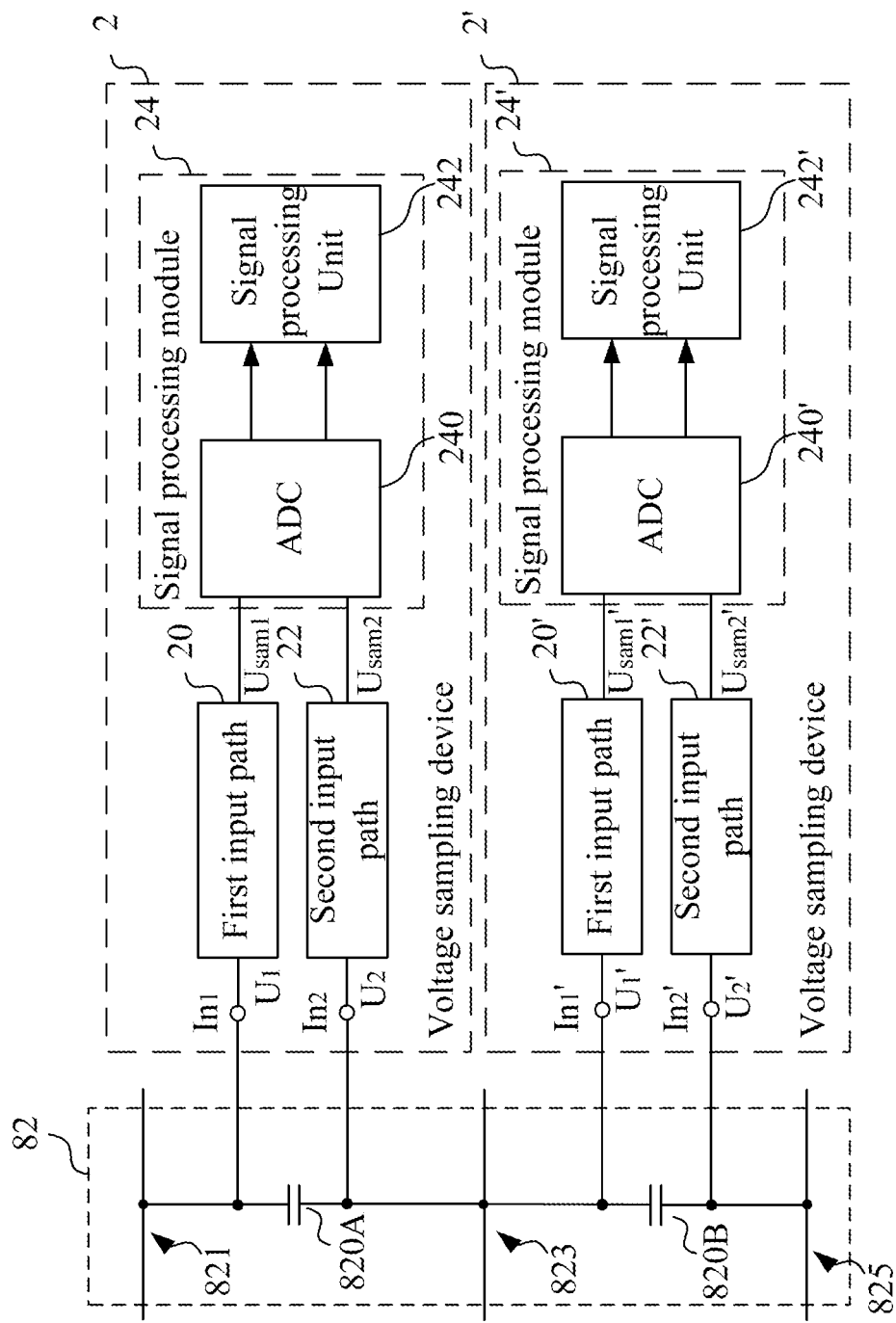
FIG. 9 is a schematic diagram illustrating a DC bus module and two voltage sampling devices according to an embodiment of the present disclosure.

Reference is now made to FIG. 9. FIG. 9 is a schematic diagram illustrating a DC bus module 82 and two voltage sampling devices 2 and 2' according to an embodiment of the present disclosure. In the present embodiment, the voltage sampling device 2 includes a first input path 20, a second input path 22 and a signal processing module 24, and the voltage sampling device 2' includes a first input path 20', a second input path 22' and a signal processing module 24'. The first input paths 20 and 20' and the second input paths 22 and 22' are represented by functional blocks, and components and operations thereof are similar to the voltage sampling device 2 shown in FIG. 2, so relative descriptions are omitted hereinafter.

In the present embodiment, the first voltage input terminal $In_1$ and the second voltage input terminal $In_2$ of the voltage sampling device 2 correspond to the DC bus 821 and the DC bus 823 of the DC bus module 82 (i.e. the two terminals of the bus capacitor 820A) respectively. The first input voltage $U_1$ and the second input voltage $U_2$ received by the voltage sampling device 2 correspond to the line voltages of the DC buses 821 and 823 respectively.

On the other hand, the first voltage input terminal $In_1'$ and the second voltage input terminal $In_2'$ of the voltage sampling device 2' correspond to the DC buses 823 and 825 of the DC bus module 82 respectively (i.e. the two terminals of the bus capacitor 820B). Therefore, the first input voltage $U_1'$ and the second input voltage $U_2'$ received by the voltage sampling device 2' correspond to the line voltages of the DC buses 823 and 825 respectively.

Hence, each DC bus voltages of the DC bus module 82 of the power conversion system 8 or 8' can be sampled via the voltage sampling devices 2 and 2'. In an embodiment, a voltage signal generated from sampling can be transmitted to other control modules (not illustrated), so as to adjust an operation mode of the power conversion system 8 according to the sampled voltage signals.

The voltage sampling devices 2 and 2' in FIG. 9 are described by using the voltage sampling device 2 in the embodiment shown in FIG. 2 as an example. In other embodiments, the voltage sampling devices 1, 3, 4 and 4' shown in the respective FIG. 1, FIG. 3, FIG. 4A and FIG. 4B can also be utilized to sample voltages.

Figure 10:
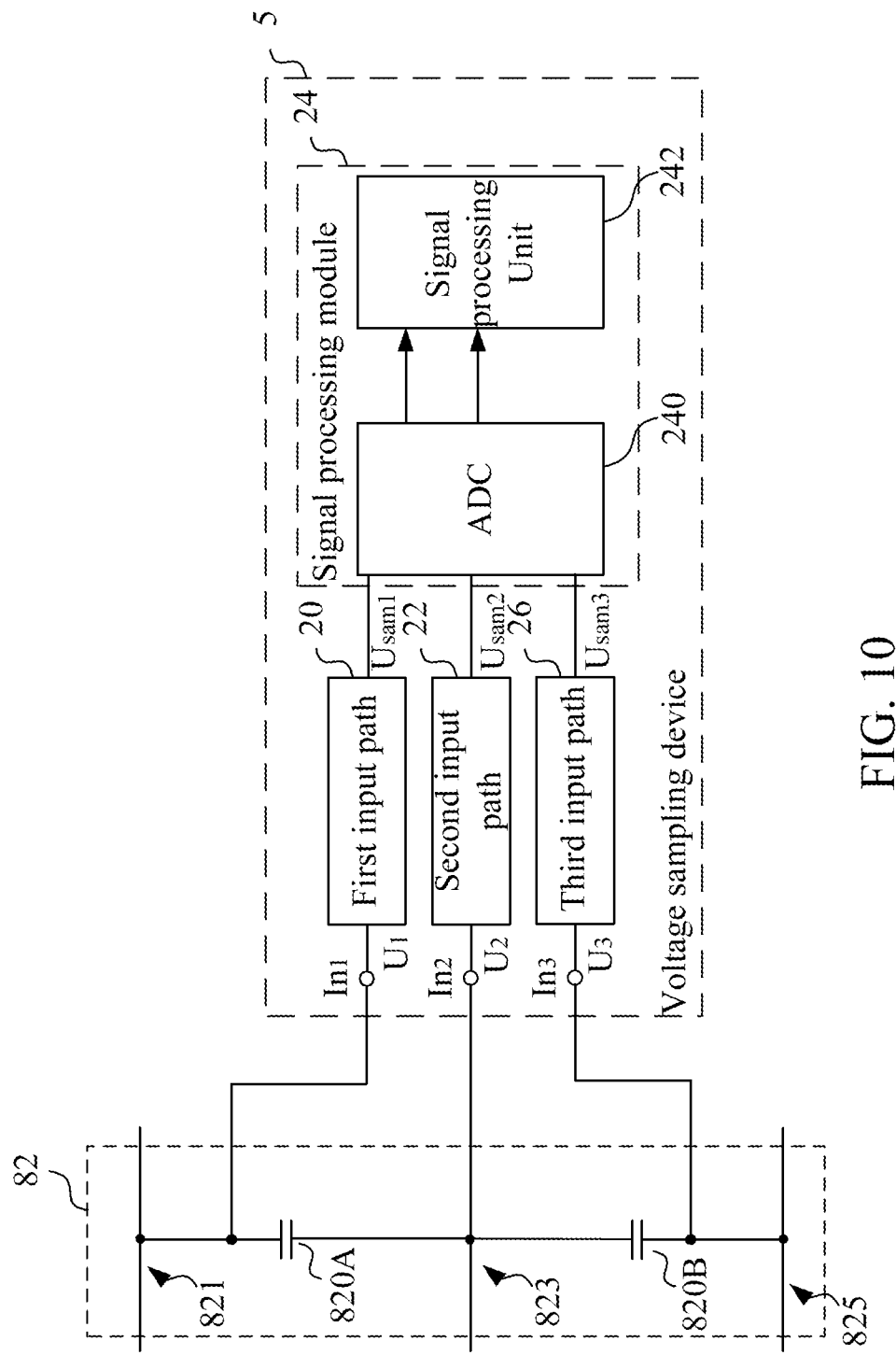
FIG. 10 is a schematic diagram illustrating a DC bus module and a voltage sampling device according to an embodiment of the present disclosure.

Reference is now made to FIG. 10. FIG. 10 is a schematic diagram illustrating a DC bus module 82 and a voltage sampling device 5 according to an embodiment of the present disclosure. In the present embodiment, the voltage sampling device 5 includes a first input path 20, a second input path 22, a signal processing module 24 and a third input path 26. The first input path 20, the second input path 22 and the third input path 26 are represented by functional blocks, and components and operations thereof are similar to the voltage sampling device 5 shown in FIG. 5, so relative descriptions are omitted hereinafter.

In the present embodiment, a first voltage input terminal $In_1$, a second voltage input terminal $In_2$ and a third voltage input terminal $In_3$ correspond to a DC bus 821, a DC bus 823 and a DC bus 825 of the DC bus module 82 (i.e. a terminal of the bus capacitor 820A, a terminal of the bus capacitor 820B and a terminal between the bus capacitors 820A and 820B) respectively. Therefore, a first input voltage $U_1$, a second input voltage $U_2$ and a third input voltage $U_3$ received by the voltage sampling device 2 correspond to the line voltages of the DC buses 821, 823 and 825 respectively.

Compare to the embodiment shown in FIG. 9, which utilizes two signal processing modules 24 and 24' and four input paths, the voltage sampling device 5 of the present embodiment achieves sampling by utilizing only one signal processing module 24 and three input paths, so the hardware cost can be lowered.

The voltage sampling devices 5 in FIG. 10 is described by using the voltage sampling device 5 in the embodiment shown in FIG. 5 as an example. In other embodiments, the voltage sampling devices 6, 7 and 7' shown in the respective FIG. 6, FIG. 7A and FIG. 7B can also be utilized to sample voltages.

Figure 11:
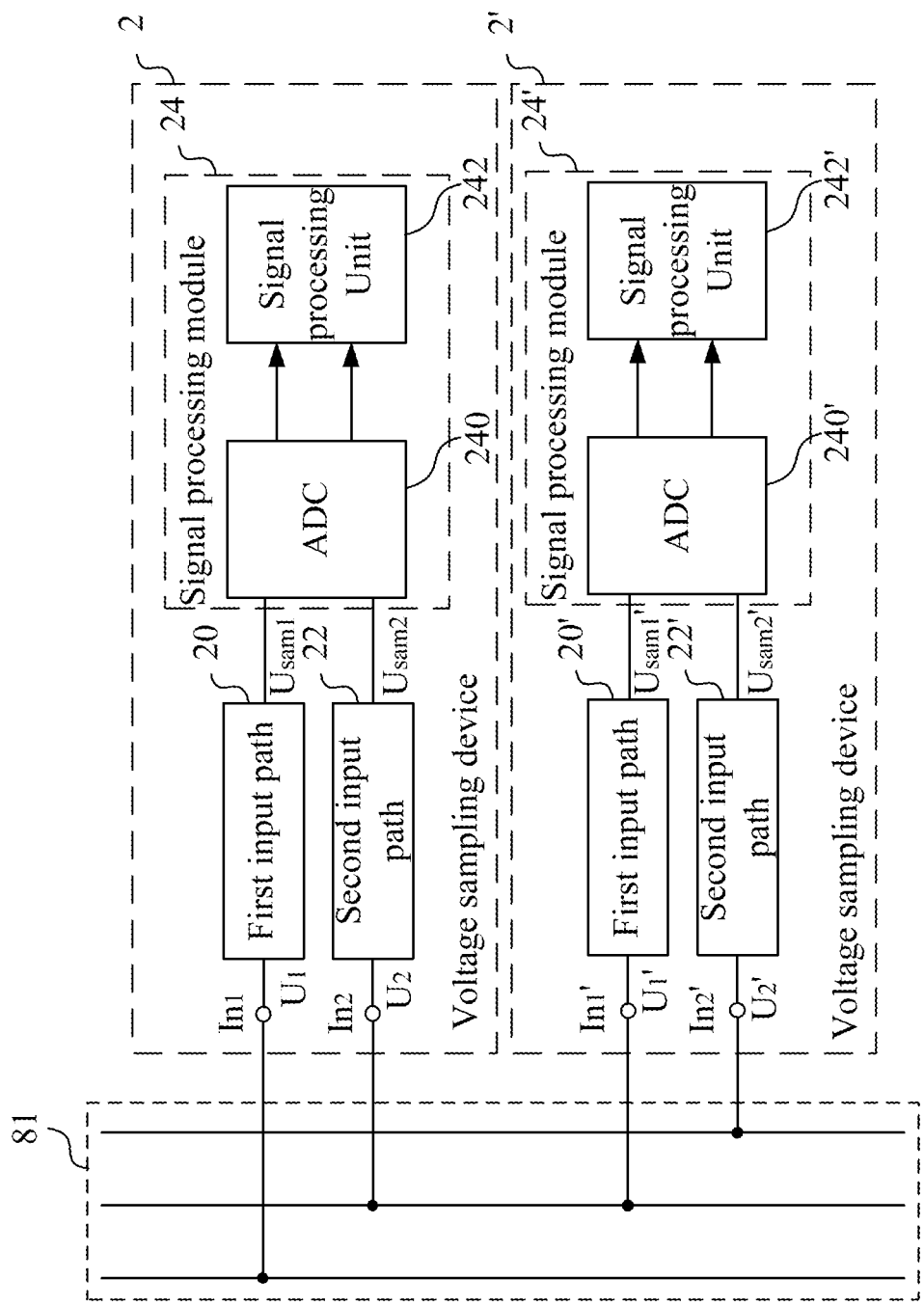
FIG. 11 is a schematic diagram illustrating a power grid and two voltage sampling devices according to an embodiment of the present disclosure.

Reference is now made to FIG. 11. FIG. 11 is a schematic diagram illustrating a power grid 81 and two voltage sampling devices 2 and 2' according to an embodiment of the present disclosure. In the present embodiment, the voltage sampling device 2 includes a first input path 20, a second input path 22 and a signal processing module 24. The voltage sampling device 2' includes a first input path 20', a second input path 22' and a signal processing module 24'. The first input paths 20 and 20' and the second input paths 22 and 22' are represented by functional blocks, and components and operations thereof are similar to the voltage sampling device 2 shown in FIG. 2, so relative descriptions are omitted hereinafter.

In the present embodiment, the first voltage input terminal $In_1$ and the second voltage input terminal $In_2$ of the voltage sampling device 2 correspond to two phases of a three-phase power grid 81. Therefore, the first input voltage $U_1$ and the second input voltage $U_2$ received by the voltage sampling device 2 correspond to AC voltages $Ve_a$ and $Ve_b$ of two phases of the three-phase power grid 81.

On the other hand, the first voltage input terminal $In_1'$ and the second voltage input terminal $In_2'$ of the voltage sampling device 2' correspond to two phases of the three-phase power grid 81. Therefore, the first input voltage $U_1'$ and the second input voltage $U_2'$ received by the voltage sampling device 2' correspond to AC voltages $Ve_b$ and $Ve_c$ of two phases of the three-phase power grid 81.

Hence, the (grid-side) three-phase AC voltages $Ve_a$, $Ve_b$ and $Ve_c$ of the power grid 81 received by the DC bus module 82 of the power conversion system 8 or 8' can be sampled via the voltage sampling devices 2 and 2'. In an embodiment, a voltage signal generated from sampling can be transmitted to other control modules (not illustrated), so as to adjust an operation mode of the power conversion system 8 according to the sampled voltage signal.

The voltage sampling devices 2 and 2' shown in FIG. 11 are described by using the voltage sampling device 2 in the embodiment shown in FIG. 2 as an example. In other embodiments, the voltage sampling devices 1, 3, 4 and 4' shown in the respective FIG. 1, FIG. 3, FIG. 4A and FIG. 4B can also be utilized to sample voltages.

Figure 12:
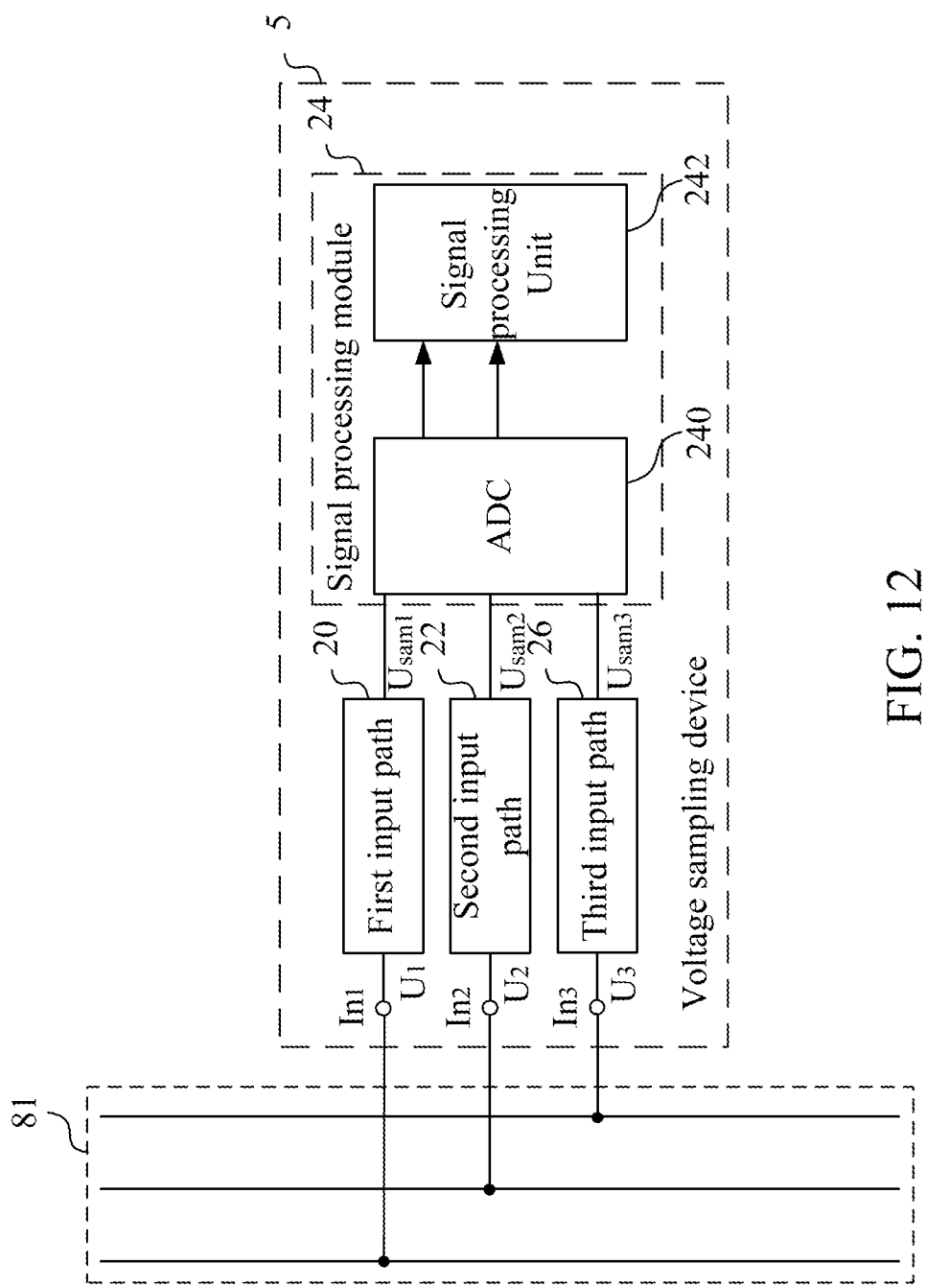
FIG. 12 is a schematic diagram illustrating a power grid and a voltage sampling device according to an embodiment of the present disclosure.

Reference is now made to FIG. 12. FIG. 12 is a schematic diagram illustrating a power grid 81 and a voltage sampling device 5 according to an embodiment of the present disclosure. In the present embodiment, the voltage sampling device 5 includes a first input path 20, a second input path 22, a signal processing module 24 and a third input path 26. The first input path 20, the second input path 22 and the third input path 26 are represented by functional blocks, and components and operations thereof are similar to those of the voltage sampling device 5 shown in FIG. 5, so relative descriptions are omitted hereinafter.

In the present embodiment, a first voltage input terminal $In_1$, a second voltage input terminal $In_2$ and a third voltage input terminal $In_3$ correspond to a power grid 81 of three phases. Therefore, the first voltage input terminal $In_1$, the second voltage input terminal $In_2$ and the third voltage input terminal $In_3$ correspond to three-phase AC voltages $Ve_a$, $Ve_b$ and $Ve_c$ of the power grid 81 received by the DC bus module 12, respectively.

Compare to the embodiment shown in FIG. 11, which utilizes two signal processing modules 24 and 24' and four input paths, the voltage sampling device 5 of the present embodiment achieves sampling by utilizing only one signal processing module 24 and three input paths, so the hardware cost can be lowered.

In an embodiment, structures shown in FIG. 11 and FIG. 12 can also be applied to three-phase AC signals $Ve_a'$, $Ve_b'$ and $Ve_c'$ generated by the sampling inverter 84 of FIG. 8A, or the motor-side three-phase AC signals $Ve_a'$, $Ve_b'$ and $Ve_c'$ generated by the motor-side converter 84' of FIG. 8B, so a relative control module can adjust operation modes of the power conversion system 8 or 8' according to the sampled voltage signal.

The voltage sampling device 5 shown in FIG. 12 is described by using the voltage sampling device 5 in the embodiment shown in FIG. 5 as an example. In other embodiments, the voltage sampling devices 6, 7 and 7' shown in the respective FIG. 6, FIG. 7 and FIG. 7A can also be utilized to sample voltages.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A voltage sampling device, comprising:
   a first input path, comprising:
      a first input voltage-dividing resistor unit, electrically coupled between a first voltage input terminal and a first node, the first input voltage-dividing resistor unit receiving a first input voltage from the first voltage input terminal;
      a second input voltage-dividing resistor unit, electrically coupled between the first node and a ground terminal, wherein the first input voltage-dividing resistor unit and the second input voltage-dividing resistor unit generate a first input divided voltage at the first node according to the first input voltage; and
      a first DC (direct current) voltage-dividing resistor unit, electrically coupled between the first node and a DC voltage source, wherein the DC voltage source generates a first DC bias voltage via the first DC voltage-dividing resistor unit at the first node, and the first DC bias voltage combines with the first input divided voltage to generate a first sampled voltage signal;
   a second input path, comprising:
      a third input voltage-dividing resistor unit, electrically coupled between a second voltage input terminal and a second node, the third input voltage-dividing resistor unit receiving a second input voltage from the second voltage input terminal;

a fourth input voltage-dividing resistor unit, electrically coupled between the second node and the ground terminal, wherein the third input voltage-dividing resistor unit and the fourth input voltage-dividing resistor unit generate a second input divided voltage at the second node according to the second input voltage; and a second DC voltage-dividing resistor unit, electrically coupled between the second node and the DC voltage source, wherein the DC voltage source generates a second DC bias voltage via the second DC voltage-dividing resistor unit at the second node, and the second DC bias voltage combines with the second input divided voltage to generate a second sampled voltage signal, wherein resistances of the third input voltage-dividing resistor unit, the fourth input voltage-dividing resistor unit and the second DC voltage-dividing resistor unit are substantially the same as the first input voltage-dividing resistor unit, the second input voltage-dividing resistor unit and the first DC voltage-dividing resistor unit;

a third input path, comprising:

a fifth input voltage-dividing resistor unit, electrically coupled between a third voltage input terminal and a third node, the fifth input voltage-dividing resistor unit receiving a third input voltage from the third voltage input terminal;

a sixth input voltage-dividing resistor unit, electrically coupled between the third node and the ground terminal, wherein the fifth input voltage-dividing resistor unit and the sixth input voltage-dividing resistor unit generate a third input divided voltage at the third node according to the third input voltage; and a third DC voltage-dividing resistor unit, electrically coupled between the third node and the DC voltage source, wherein the DC voltage source generates a third DC bias voltage via the third DC voltage-dividing resistor unit at the third node, and the third DC bias voltage combines with the third input divided voltage to generate a third sampled voltage signal, wherein resistances of the fifth input voltage-dividing resistor unit, the sixth input voltage-dividing resistor unit and the third DC voltage-dividing resistor unit are substantially the same as the first input voltage-dividing resistor unit, the second input voltage-dividing resistor unit and the first DC voltage-dividing resistor unit; and a signal processing module, the signal processing module receiving the first sampled voltage signal, the second sampled voltage signal and the third sampled voltage signal to perform signal processing.

2. The voltage sampling device of claim 1, wherein the first input path further comprises a first voltage follower unit which is electrically coupled to the first node, so the first sampled voltage signal is transmitted to the signal processing module via the first voltage follower unit, and the second input path further comprises a second voltage follower unit which is electrically coupled to the second node, so the second sampled voltage signal is transmitted to the signal processing module via the second voltage follower unit.

3. The voltage sampling device of claim 2, wherein the first input path further comprises a first matching resistor unit which is electrically coupled between the first voltage follower unit and the signal processing module, and the second input path further comprises a second matching resistor unit which is electrically coupled between the second voltage follower unit and the signal processing module.

4. The voltage sampling device of claim 1, wherein the signal processing module comprises an ADC (analog to digital converter) and a signal processing unit.

5. The voltage sampling device of claim 1, wherein the DC voltage source is a positive DC voltage source, so as to bias the first sampled voltage signal and the second sampled voltage signal to a range acceptable by the signal processing module.

6. The voltage sampling device of claim 1, further comprising a common mode choke module, electrically coupled between the first input path and the second input path.

7. The voltage sampling device of claim 1, wherein each of the first input voltage and the second input voltage is an AC (alternating current) power source.

8. The voltage sampling device of claim 1, wherein each of the first input voltage and the second input voltage is a DC power source.

9. The voltage sampling device of claim 1, wherein the third input path further comprises a third voltage follower unit which is electrically coupled to the third node, so the third sampled voltage signal is transmitted to the signal processing module via the third voltage follower unit.

10. The voltage sampling device of claim 9, wherein the third input path further comprises a third matching resistor unit which is electrically coupled between the third voltage follower unit and the signal processing module.

11. The voltage sampling device of claim 1, further comprising a common mode choke module, electrically coupled between the first input path, the second input path and the third input path.

12. The voltage sampling device of claim 1, wherein the third input voltage is an AC power source.

13. The voltage sampling device of claim 1, wherein the third input voltage is a DC power source.

14. A power conversion system, comprising:

a grid-side converter, electrically coupled to a power grid, the grid-side converter converting grid-side three-phase AC voltages to a plurality of DC bus voltages;

a DC bus module, comprising a plurality of DC buses and at least one bus capacitor, wherein the bus capacitor is electrically coupled to two neighboring DC buses of the plurality of DC buses;

a motor-side converter, electrically coupled to the grid-side converter via the DC bus module, the motor-side converter generating motor-side three-phase AC voltages according to the plurality of DC bus voltages transmitted by the DC bus module; and at least one voltage sampling device, comprising:

a first input path, comprising:

a first input voltage-dividing resistor unit, electrically coupled between a first voltage input terminal and a first node, the first input voltage-dividing resistor unit receiving a first input voltage from the first voltage input terminal;

a second input voltage-dividing resistor unit, electrically coupled between the first node and a ground terminal, wherein the first input voltage-dividing resistor unit and the second input voltage-dividing resistor unit generate a first input divided voltage at the first node according to the first input voltage; and a first DC voltage-dividing resistor unit, electrically coupled between the first node and a DC voltage source, wherein the DC voltage source generates a first DC bias voltage via the first DC voltage-dividing resistor unit at the first node, and the first DC bias voltage combines with the first input divided voltage to generate a first sampled voltage signal;

a second input path, comprising:
  a third input voltage-dividing resistor unit, electrically coupled between a second voltage input terminal and a second node, the third input voltage-dividing resistor unit receiving a second input voltage from the second voltage input terminal;
  a fourth input voltage-dividing resistor unit, electrically coupled between the second node and the ground terminal, wherein the third input voltage-dividing resistor unit and the fourth input voltage-dividing resistor unit generate a second input divided voltage at the second node according to the second input voltage; and
  a second DC voltage-dividing resistor unit, electrically coupled between the second node and the DC voltage source, wherein the DC voltage source generates a second DC bias voltage via the second DC voltage-dividing resistor unit at the second node, and the second DC bias voltage combines with the second input divided voltage to generate a second sampled voltage signal, wherein resistances of the third input voltage-dividing resistor unit, the fourth input voltage-dividing resistor unit and the second DC voltage-dividing resistor unit are substantially the same as the first input voltage-dividing resistor unit, the second input voltage-dividing resistor unit and the first DC voltage-dividing resistor unit;

a third input path, comprising:
  a fifth input voltage-dividing resistor unit, electrically coupled between a third voltage input terminal and a third node, the fifth input voltage-dividing resistor unit receiving a third input voltage from the third voltage input terminal;
  a sixth input voltage-dividing resistor unit, electrically coupled between the third node and the ground terminal, wherein the fifth input voltage-dividing resistor unit and the sixth input voltage-dividing resistor unit generate a third input divided voltage at the third node according to the third input voltage; and
  a third DC voltage-dividing resistor unit, electrically coupled between the third node and the DC voltage source, wherein the DC voltage source generated a third DC bias voltage via the third DC voltage-dividing resistor unit at the third node, and the third DC bias voltage combines with the third input divided voltage to generate a third sampled voltage signal, wherein resistances of the fifth input voltage-dividing resistor unit, the sixth input voltage-dividing resistor unit and the third DC voltage-dividing resistor unit are substantially the same as the first input voltage-dividing resistor unit, the second input voltage-dividing resistor unit and the first DC voltage-dividing resistor unit; and a signal processing module, the signal processing module receiving the first sampled voltage signal, the second sampled voltage signal and the third sampled voltage signal to perform signal processing;

wherein the first voltage input terminal, the second voltage input terminal and the third voltage input terminal are electrically coupled to the power grid or the DC buses or the motor-side converter.

15. The voltage sampling device of claim 14, wherein the first input path further comprises a first voltage follower unit which is electrically coupled to the first node, so the first sampled voltage signal is transmitted to the signal processing module via the first voltage follower unit, and the second input path further comprises a second voltage follower unit which is electrically coupled to the second node, so the second sampled voltage signal is transmitted to the signal processing module via the second voltage follower unit.

16. The voltage sampling device of claim 15, wherein the first input path further comprises a first matching resistor unit which is electrically coupled between the first voltage follower unit and the signal processing module, and the second input path further comprises a second matching resistor unit which is electrically coupled between the second voltage follower unit and the signal processing module.

17. The voltage sampling device of claim 14, wherein the signal processing module comprises an ADC (analog to digital converter) and a signal processing unit.

18. The voltage sampling device of claim 14, wherein the DC voltage source is a positive DC voltage source, so as to bias the first sampled voltage signal and the second sampled voltage signal to a range acceptable by the signal processing module.

19. The voltage sampling device of claim 14, further comprising a common mode choke module, electrically coupled between the first input path and the second input path.

20. The voltage sampling device of claim 14, wherein the third input path further comprises a third voltage follower unit which is electrically coupled to the third node, so the third sampled voltage signal is transmitted to the signal processing module via the third voltage follower unit.

21. The voltage sampling device of claim 14, wherein the third input path further comprises a third matching resistor unit which is electrically coupled between the third voltage follower unit and the signal processing module.

22. The voltage sampling device of claim 14, further comprising a common mode choke module, electrically coupled between the first input path, the second input path and the third input path.

* * * * *